United States Patent [19]

Blanchard

[11] Patent Number: 4,707,909
[45] Date of Patent: Nov. 24, 1987

[54] MANUFACTURE OF TRIMMABLE HIGH VALUE POLYCRYSTALLINE SILICON RESISTORS

[75] Inventor: Richard A. Blanchard, Los Altos, Calif.

[73] Assignee: Siliconix Incorporated, Santa Clara, Calif.

[21] Appl. No.: 894,416

[22] Filed: Aug. 8, 1986

[51] Int. Cl.[4] .................. H01L 21/477; H01L 27/00; H01L 31/00

[52] U.S. Cl. ............................... 437/109; 29/610 R; 148/DIG. 46; 148/DIG. 71; 148/DIG. 94; 148/DIG. 136; 357/51

[58] Field of Search ............ 29/576 C, 577 C, 610 R, 29/574; 427/53.1; 219/121.LZ, 121 LB, 121 LH; 357/51, 59; 148/DIG. 136, 179

[56] References Cited

U.S. PATENT DOCUMENTS 4,309,224  1/1982  Shibata ................. 148/1.5
4,467,312  8/1984  Komatsu ............... 29/577 C
4,602,421  7/1986  Lee et al. .............. 29/576 C

OTHER PUBLICATIONS

Parisi, "Integrated Resistor Trimming", IBM Tech. Dis. Bulletin, vol. 17, No. 10, Mar. 1975, p. 2878.
Lee et al., "On the Semi-insulating . . . Resistor", Solid-State Electronics, vol. 27, No. 11, pp. 995-1001, 1984.

*Primary Examiner*—Brian E. Hearn
*Assistant Examiner*—Chi-Tso Huang
*Attorney, Agent, or Firm*—Alan H. MacPherson; Paul J. Winters; Kenneth E. Leeds

[57] ABSTRACT

A process of providing semi-insulating thin film resistors with closer tolerance values by furnance-annealing the film to increase is resistance to less than the final intended value, and then focused heat source-annealing the film to within a close tolerance of the final intended value.

13 Claims, 6 Drawing Figures

MANUFACTURE OF TRIMMABLE HIGH VALUE POLYCRYSTALLINE SILICON RESISTORS

BACKGROUND

This invention relates to semiconductor devices, and more specifically to polycrystalline silicon resistors with high, and close tolerance, resistance values.

In an integrated circuit (IC) or other device formed on a semiconductor substrate, resistors may be formed from several hundred to several thousand angstroms of thin film deposited over insulation on the surface of the substrate, and connected between two conductors. In integrated circuit devices, such isolated resistors are useful for their range of sheet resistance values, low temperature coefficients, freedom of positioning on the surface of the IC, electrical isolation from other elements of the circuit, and trimmability by a focused heat source cutting or physically evaporating a pattern of the film to increase its resistance and to improve resistance tolerance precision.

Resistive thin films are often formed of amorphous silicon, doped with chromium and traces of carbon, boron or other elements for resistance and temperature coefficient optimization. Thin film resistors of this nature are usually deposited by the well-known technique of sputtering. In sputtering, a high intensity radio frequency field is applied, through electrodes or a coil, to a low pressure gas, from which a "glow discharge" of ions bombards or "sputters" a target composed of resistor constituents in appropriate proportions, dislodging atoms from the target to condense and form a thin film on a substrate positioned nearby. Even for use as a thin film resistor, silicon must have its conductivity increased by doping, with either P type (e.g., boron) or N type (e.g., arsenic phosphorous) impurities, for hole or electron flow, respectively. Silicon can be doped with impurities while or after being deposited as a film, but whenever doping is done, the need to control doping concentration precisely makes it difficult to obtain accurate resistance values. The sputtering equipment and process are difficult to control, leaving a need for an alternate technique of providing thin film resistors.

Thin film resistors can also be formed of polycrystalline silicon deposited by conventional CVD techniques. Polycrystalline silicon is an aggregation of small, randomly oriented grains of silicon crystals whose lattices mismatch, forming boundaries between grains. Solid State Electronics, Vol. 27, No. 11, pp. 995-1001, 1984, reports that resistive thin film dopant diffusion can be controlled by combining acceptor (e.g., boron) and donor (e.g., phosphorus) doping to form a high resistance or "semi-insulating" resistor. In this prior art process, a polycrystalline silicon film is deposited on insulating oxide over a silicon substrate, blanket implanted with phosphorous atoms, annealed a first time, masked and etched, forming a pattern of polycrystalline silicon resistor areas, which are then implanted with boron atoms to a concentration no greater than that of the phosphorus atoms. The doubleimplanted film is annealed a second time, at 1000° C. for at least 10 minutes, repairing implantation damage and increasing polycrystalline silicon grain size, but more importantly thermally activating dopants at an approximately predictable rate, so that practically all boron atoms become associated with, and are neutralized or deactivated by, phosphorus atoms, which offsets the conductivity, or increases the resistance, of the double-implanted resistor areas. After neutralization, resistor values are $10^3$ to $10^4$ times higher than values of conventional polycrystalline silicon thin film resistors doped with the same concentration of phosphorus. However, the resistance value tolerance remains wider than desired.

SUMMARY

This invention takes advantage of the effect of twice doped silicon resistance increasing with increasing anneal temperature, to trim high resistance films to closer resistance value tolerances, by using a laser or other focused heat source for a dynamic feedback controlled third anneal.

Polycrystalline silicon thin films are deposited, doped and annealed a first time, patterned, and doped a second time conventionally, but annealed a second time at a reduced temperature to limit the increase in resistance to less than the value ultimately intended. Then, the thin film is covered with passivation, through which contacts are formed with conductive leads, and connected to an external resistance measuring device. The resistance is monitored while the thin film is annealed a third time by a locally focused heat source, such as a laser beam, until the measuring circuit detects that the resistance has reached the intended final value, and turns off the focused heat source. The twice annealed resistor value tolerance is improved by the individually controlled third anneal.

DETAILED DESCRIPTION

Figure 1:
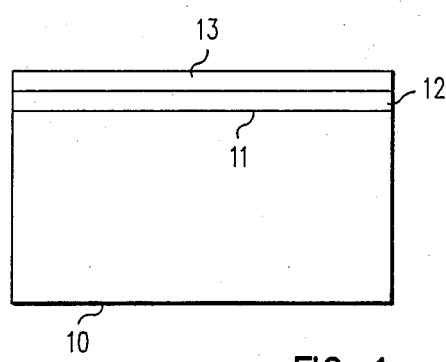
FIGS. 1 through 6 are cross-sections illustrating steps in a sequence for forming resistors according to this invention.

The present invention provides high resistance thin film polycrystalline silicon resistors with improved (closer) tolerance resistance values. Referring to FIG. 1, the process preferably begins with a semiconductor wafer 10 having an upper surface 11 covered with a dielectric layer such as silicon dioxide 12, which is in turn covered with several hundred to several thousand angstroms of chemical vapor deposited polycrystalline silicon film 13.

Next, polycrystalline silicon film 13 is doped a first time by ion implantation or by thermal predeposition of N type atoms (e.g. phosphorous). N- doped film 13 and wafer 10 are annealed for example, in a suitable furnace at approximately 1000° C. for ten minutes, to activate N type dopant atoms.

Figure 2:
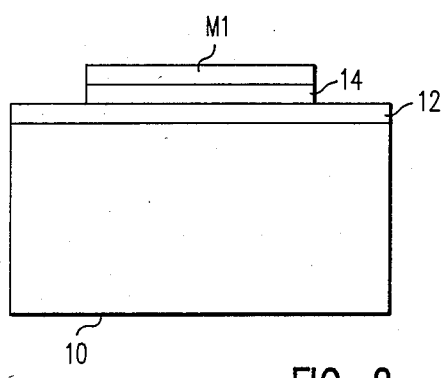

Referring to FIG. 2, photoresist is applied and patterned to form mask M1 protecting (once doped and annealed) film 13 areas 14 designated for formation of conductors or resistors, while exposed areas are etched, leaving thin film pattern 14. Alternatively, film 13 can be left unpatterned and intact until after the second doping and annealing steps below.

Figure 3:
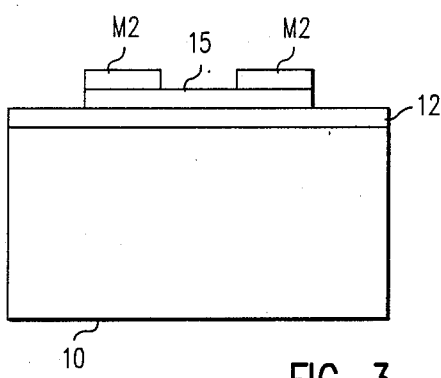
Figure 6:
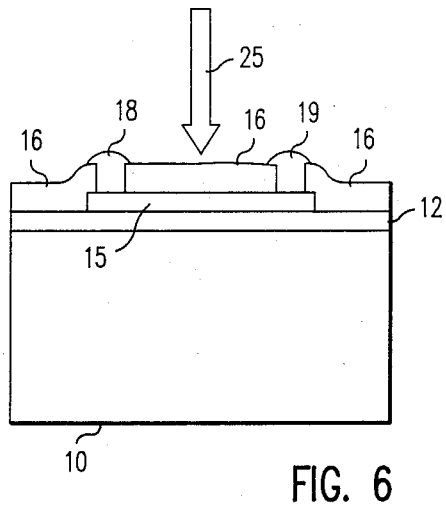

If desired, selected areas of unpatterned film 13 or of patterned film 14 can be preserved in the once doped conductive state by employing a second photoresist mask M2, FIG. 3, to block a subsequent second doping. With or without optional mask M2, exposed film areas 15 are then doped with P type atoms (e.g. boron) by ion implantation or by thermal predeposition, to a concentration not exceeding the N type (phosphorus) dopant concentration. Alternatively, film 13 can be doped first with P type atoms, annealed, and doped second with N type atoms. After doping, mask M1 or M2 is removed.

Twice-doped film 15 and wafer 10 are annealed a second time to activate P type (boron) atoms to recombine with N type (phosphorus) atoms by the deactivation mechanism referred to in the prior art reference. However, the second anneal temperature is limited so that film 15 resistance increases to no closer than the maximum tolerance variation from the value ultimately intended.

Figure 4:
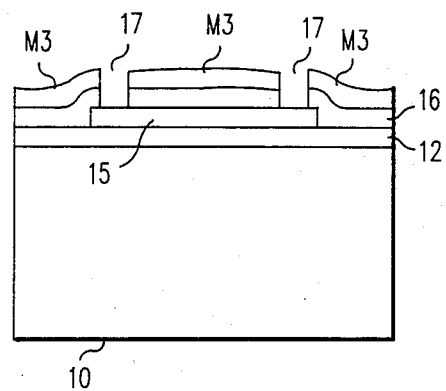

Then, twice doped, twice annealed, and patterned film 15 is covered by transparent silicon oxide or semi-transparent silicon nitride passivating layer 16, FIG. 4, formed, for example, by chemical vapor deposition. Next, photoresist is deposited and patterned to form mask M3 over passivating layer 16, exposed areas of which are then etched, opening contact holes 17 down to thin film resistor area 15.

Figure 5:
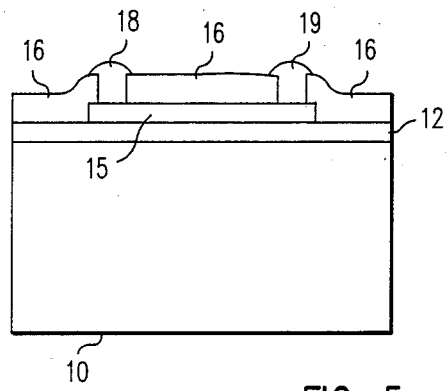

Next, a conductive metallization layer is deposited and etched to form a metallization pattern including contacts 18 and 19, FIG. 5.

Contacts 18 and 19 are connected through conductive leads, not shown, to an external resistance measuring device such as an ohmmeter, curve tracer, test computer, or the like, not shown, which monitors the resistance of resistor 15 continuously and in a well known fashion to control and direct a focused heat source 25 such as an electron beam or laser through passivation 16 to scan and locally heat resistor 15 until the desired resistance value is attained. In contrast to prior art trimming techniques, this resistance adjustment or "trimming" by focused heat does not cut or eliminate the thin film.

Typically, an integrated circuited device includes many such thin film resistors 15, and the third anneal resistance "trimming" operation is repeated by switching the resistance monitoring device and focused heat source 25 to another resistor 15.

A preferred embodiment has been illustrated, of which modifications and adaptations within the scope of the invention will occur to those skilled in the art. The invention is limited only by the scope of the following claims.

I claim:

1. A process for forming a thin film resistor on insulation over a semiconductor substrate, in which process a polycrystalline silicon film is deposited by chemical vapor deposition on said insulation, doped with first conductivity type ions to a first concentration, annealed a first time, doped with second conductivity type ions to a second concentration, annealed a second time to increase the film resistance to no more than within the maximum tolerance deviation from its intended final value; and locally annealed a third time using a focused heat source to increase resistance in a selected area of the film.

2. A process as in claim 1 wherein the thin film selected area resistance value is monitored continuously for feedback control of the third anneal by the focused heat source.

3. A process for forming a resistor, including the steps of:
providing a substrate comprising a semiconductor wafer having an initial planar surface covered with dielectric:
providing a polycrystalline silicon thin film by chemical vapor deposition on said dielectric:
doping the film with a first concentration of first conductivity type atoms in first selected areas:
first time annealing the film and substrate in a furnace:
doping the film with a second concentration of second conductivity type atoms in second selected areas:
second time annealing the film and substrate in a furnace at a temperature selected to cause a limited increase in the second selected area resistance value:
connecting the second selected area to an external resistance measuring device: and
monitoring the second selected area resistance value while using a focused heat source to locally anneal the second selected area until the second selected area resistance has increased to a specified value.

4. A process as in claim 3 wherein the step of first time annealing is followed by the step of patterning the film.

5. A process as in claim 3 wherein the second selected areas are within, and smaller than, the first selected areas.

6. A process as in claim 3 wherein the second concentration is no greater than the first concentration.

7. A process as in claim 3 wherein the step of second time annealing is followed by the step of covering the thin film with passivation, and wherein the step of connecting the thin film to an external device includes the step of providing conductive leads with contacts through the passivation to each second selected resistor area of the thin film.

8. A process as in claim 3 wherein doping is done by ion implantation.

9. A process as in claim 3 wherein doping is done by thermal predeposition and drive-in diffusion.

10. A process as in claim 3 wherein the first conductivity type is N type and the second conductivity type is P type.

11. A process as in claim 10 wherein the N type ions are phosphorus and the P type ions are boron.

12. A process as in claim 3 wherein the focused heat source is a laser.

13. A process as in claim 3 wherein the focused heat source is an electron beam.

* * * * *

UNITED STATES PATENT AND TRADEMARK OFFICE
CERTIFICATE OF CORRECTION

PATENT NO. : 4,707,909

DATED : 11/24/87

INVENTOR(S) : Richard A. Blanchard

It is certified that error appears in the above-identified patent and that said Letters Patent is hereby corrected as shown below: On The Title Page:

On the cover page, item (21), change the Appl. No. "894,416" to --894,418--.

In the Abstract, line 3, change "is" to --its--.

Signed and Sealed this

Eighth Day of November, 1988

Attest:

DONALD J. QUIGG

Attesting Officer

Commissioner of Patents and Trademarks